United States Patent
Chien

(10) Patent No.: US 10,132,841 B2
(45) Date of Patent: Nov. 20, 2018

(54) CLAMP METER

(71) Applicant: PEACEFUL THRIVING ENTERPRISE CO., LTD., Changhua County (TW)

(72) Inventor: Shih-Hsiang Chien, Changhua County (TW)

(73) Assignee: PEACEFUL THRIVING ENTERPRISE CO., LTD., Changhua County (TW)

( * ) Notice: Subject to any disclaimer, the term of this patent is extended or adjusted under 35 U.S.C. 154(b) by 151 days.

(21) Appl. No.: 15/427,058

(22) Filed: Feb. 8, 2017

(65) Prior Publication Data

US 2018/0224482 A1     Aug. 9, 2018

(51) Int. Cl.
    *G01R 15/18*     (2006.01)
    *G01R 15/12*     (2006.01)

(52) U.S. Cl.
    CPC ......... *G01R 15/186* (2013.01); *G01R 15/125* (2013.01)

(58) Field of Classification Search
    CPC ...... G01R 1/06788; G01R 1/22; G01R 11/04; G01R 13/0281; G01R 13/405; G01R 13/406; G01R 15/14; G01R 15/142; G01R 15/148; G01R 15/186; G01R 15/188; G01R 15/247; G01R 19/0092
    USPC .... 324/96, 126, 127, 149, 150, 556, 754.02; 336/176
    See application file for complete search history.

(56) References Cited

U.S. PATENT DOCUMENTS

| | | | | |
|---|---|---|---|---|
| 4,214,200 A | * | 7/1980 | Hollander | G01R 13/405 324/122 |
| 5,349,289 A | * | 9/1994 | Shirai | G01R 1/22 324/116 |
| 5,610,512 A | * | 3/1997 | Selcuk | G01R 1/04 324/127 |
| 2007/0017301 A1 | * | 1/2007 | Prsha | G01V 3/081 73/860 |
| 2013/0208761 A1 | * | 8/2013 | Mavrides | G01J 5/089 374/121 |
| 2014/0266225 A1 | * | 9/2014 | Coleman | G01R 1/22 324/426 |
| 2016/0084879 A1 | * | 3/2016 | Luo | G01R 1/0416 324/127 |
| 2016/0204617 A1 | * | 7/2016 | Gilbert | H02J 5/005 73/865.9 |
| 2016/0223588 A1 | * | 8/2016 | Fox | G01J 5/0896 |

\* cited by examiner

*Primary Examiner* — Jeff Natalini
*Assistant Examiner* — Steven Yeninas
(74) *Attorney, Agent, or Firm* — Raymond Y. Chan; David and Raymond Patent Firm

(57) ABSTRACT

A clamp meter is revealed. The clamp includes a pair of jaws disposed on a main body. The main body is arranged with a display panel and a plurality of buttons. The pair of jaws can be opened or closed by manual operation to get data of an object that users intend to measure. The data is transferred to the main body and shown on the display panel. Users can switch to the electrical parameter that they need by pressing the buttons. The clamp meter features on a plurality of indicator lights disposed on the pair of jaws. Users can obtain current data directly by observing the indicator lights.

5 Claims, 4 Drawing Sheets

CLAMP METER

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a test meter, especially to a clamp meter that measures electrical parameters such as current, voltage, etc. of wires.

Description of Related Arts

Generally, a clamp meter is a test meter with a pair of jaws and used for measuring current on wires/cables. Nowadays the clamp meter with more functions is able to measure more electrical parameters such as voltage. A processor in the clamp meter can be used to test voltage. Some clamp meters even have the same basic functions as the digital multimeter (DMM). Refer to U.S. Pat. No. 6,975,104B2, a clamp meter with dual displays is revealed. The current/voltage signal obtained is sent to the displays to be read by users. However, users are unable to get data of electrical parameters once the display is out of order. Moreover, users are unable to learn whether an object to be tested is carrying electric current immediately. Thus users' safety remains a concern.

SUMMARY OF THE PRESENT INVENTION

Therefore it is a primary object of the present invention to provide a clamp meter that reaches a higher safety with a plurality indicator lights on first and second jaws thereof. Besides reading on the display, the indicator lights show users that whether an object measured is carrying electric current and users can learn the magnitude/range of the current directly. Thus users can get electrical parameters such as current, voltage, and etc. immediately and injuries from contact with live parts can also be avoided.

In order to achieve the above object, a clamp meter according to the present invention includes a main body, a first jaw and a second jaw. A processor is built in the main body and used for processing various kinds of electrical parameters such as alternate current (AC) voltage, direct current (DC) voltage, resistance, current, and etc. being measured. The main body is also arranged with a display panel and a plurality of buttons, usually on a front surface thereof.

The first jaw and the second jaw are both pivotally connected to a top end of the main body and used for detection of current and voltage. The first jaw and the second jaw are set correspondingly, able to be closed or opened. Each jaw includes a first end and a second end extended from the first end. A first current transformer and a second current transformer are set between the two ends of the first jaw and the two ends of the second jaw respectively. Each current transformer is formed by a plurality of silicon steel sheets stacked and each silicon steel sheet is covered with an insulating coating. After sensing electromagnetic signals related to current, voltage or resistance, a sensor connected to the first and the second current transformers gets signals. A test space is formed between the two second ends of the first and the second jaws closed toward each other. The test space is used for detecting flowing of the current. A plurality of indicator lights is disposed on a surface between the first end and the second end and arranged along the jaws. Circuit of the sensor is connected to the indicator lights and also connected to the processor of the main body. An object detected is set within the test space and then the first and the second current transformers detect the object, generate signals and transfer the signals to the sensor. Next the sensor sends the signals to the indicator lights and the processor of the main body respectively. The indicator lights are turned on according to the signals received and the magnitude of the current is represented by the number of the indicator lights turned on. The precise data of the current and the voltage is also shown in the display panel of the main body.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
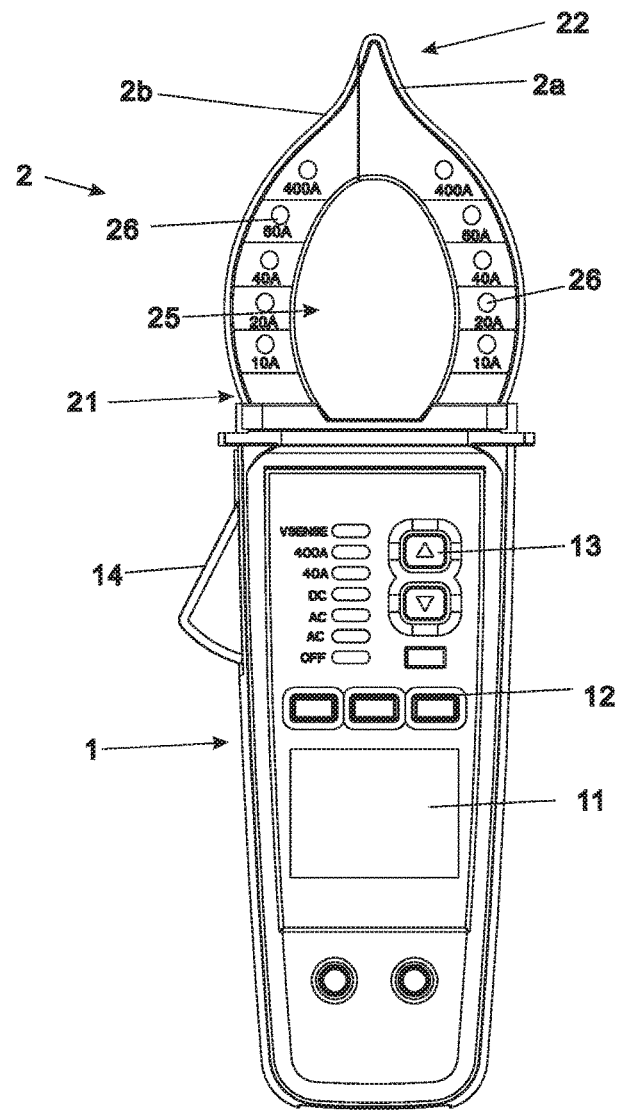
FIG. 1 is a perspective view of an embodiment according to the present invention.

Refer to FIG. 1, a clamp meter of the present invention includes a main body 1, a first jaw 2a and a second jaw 2b. The main body 1 is built in with a processor (not shown in figure) for processing and measuring various kinds of electrical parameters including alternate current (AC) voltage, direct current (DC) voltage, resistance, current, and etc. The main body 1 consists of a display panel 11 disposed on a front surface thereof and a plurality of buttons 12, 13, 14. The button 13 is used for controlling or switching of signal processed such as processing of current signals, voltage signals, resistance signals, etc. The button 12 is used as an on/off switch and for process switching.

Figure 2:
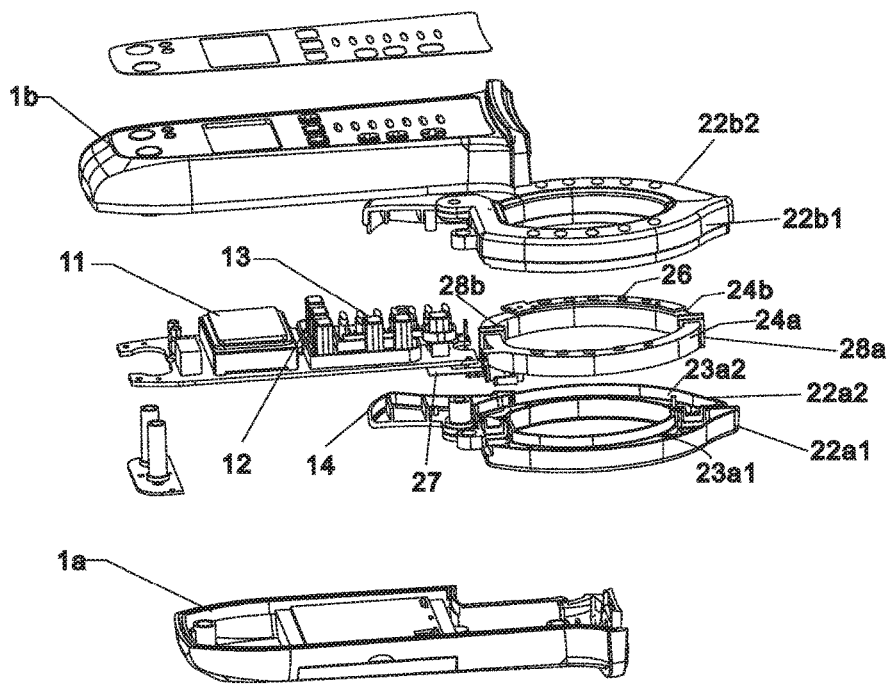
FIG. 2 is an explosive view of an embodiment according to the present invention.
Figure 3:
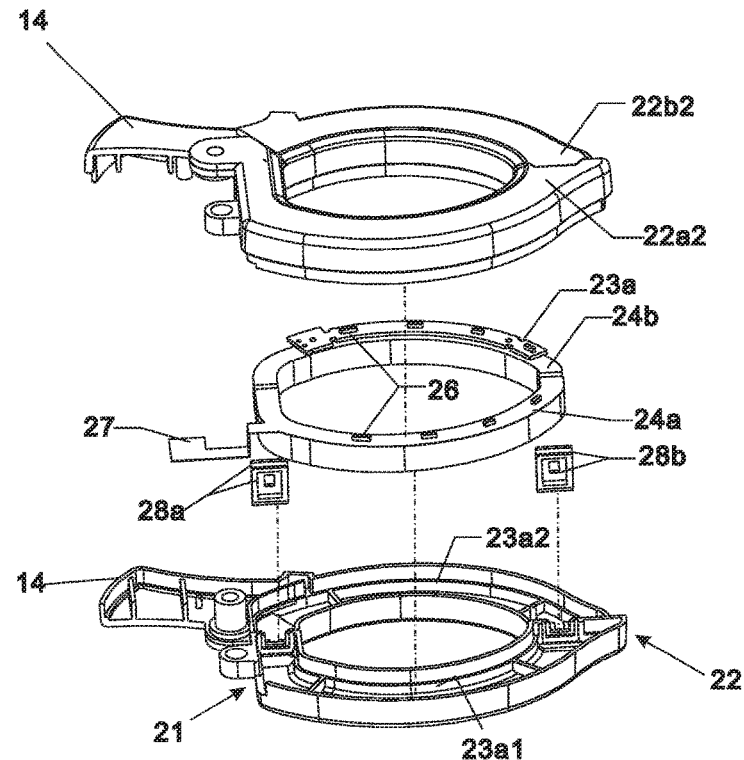
FIG. 3 is an enlarged explosive view of a first jaw and a second jaw of an embodiment according to the present invention.
Figure 4:
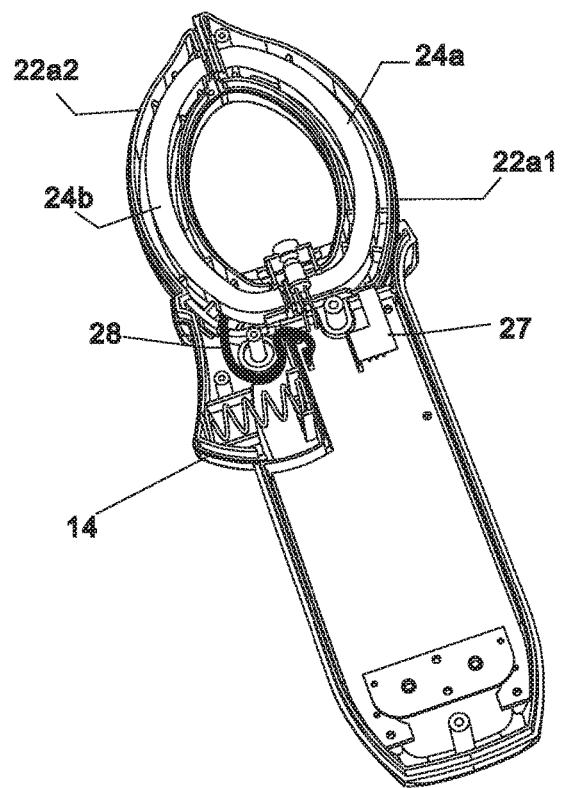
FIG. 4 is a longitudinal sectional view of an embodiment according to the present invention.

The first jaw 2a and the second jaw 2b both are disposed on and extended from a top end of the main body 1, as shown in FIG. 2 and FIG. 3. The first jaw 2a and the second jaw 2b are disposed correspondingly to each other, able be opened or closed. A test space 25 is formed when the first jaw 2a and the second jaw 2b are closed toward each other. The button 14 is formed by extension of a first end 21 of the first jaw 2a. The opening and closing of the first jaw 2a and the second jaw 2b are controlled by the button 14. In this embodiment, the first jaw 2a and the second jaw 2b are formed by connection of first housings 22a1, 22a2 with second housings 22b1, 22b2 respectively. The first housing 22a1/22a2 is disposed with a slot 23a1/23a2. Each of the first jaw 2a and the second jaw 2b includes the first end 21 and a second end 22 extended from the first end 21. The slot 23a1 of the first housing 22a1 is mounted with a first current transformer 24a while the slot 23a2 of the first housing 22a2 is mounted with a second current transformer 24b, as shown in FIG. 3 and FIG. 4. Then the second housings 22b1, 22b2 and the first housings 22a1, 22a2 are connected correspondingly to form the first jaw 2a and the second jaw 2b. The first end 21 of the first jaw 2a and the second end 22 of the second jaw 2b are disposed with a non-conductive barrier 28a and a non-conductive barrier 28b respectively. Thereby the first end 21 and the second end 22 are separated from each other by the non-conductive barriers 28a, 28b and a contact surface therebetween is non-conductive when the first jaw 2a and the second jaw 2b are closed. An electromagnetic field formed by current through the object within the test space 25 between the first jaw 2a and the second jaw 2b is detected by the first current transformer 24a and the second current transformer 24b and a corresponding electromagnetic signal is generated.

A surface of the first jaw 2a and a surface of the second jaw 2b are disposed with a plurality of indicator lights 26 respectively. The indicator lights 26 are arranged along the first jaw 2a and the second jaw 2b and each indicator light 26 is labeled with the number of current therebeside. The circuit of the indicator lights 26 is connected to the first current transformer 24a and the second current transformer 24b. The power source of the indicator lights 26 is from a circuit 28 connected to a power supply of the main body 1. An object detected is placed into the test space 25. An electromagnetic field formed by current through the object within the test space 25 is detected by the first current transformer 24a and the second current transformer 24b and a corresponding electromagnetic signal is generated. Then a sensor (not shown in the figure) connected to the first current transformer 24a and the second current transformer 24b gets the electromagnetic signal. Next a certain number of indicator lights 26 are turned on according to the electromagnetic signal measured. The number of the indicator lights 26 turned on is proportional to the magnitude of the signal obtained. In other words, the number of the indicator lights 26 on the first jaw 2a and the second jaw 2b turned on is increased or decreased according to the signal obtained when the first jaw 2a and the second jaw 2b detect the voltage or the current. The indicator lights 26 can warn and remind the users clearly.

After the electromagnetic signal being obtained by the sensor connected to the first current transformer 24a and the second current transformer 24b, the sensor sends the signal measured to the indicator lights 26 for lighting the indicator lights 26 directly. The sensor also sends the signal measured to the processor (not shown in figures) of the main body 1 through another circuit 27 to display detailed data of the voltage/current signals on the display panel 11 of the main body 1.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:
1. A clamp meter comprising:
a main body having a processor that is built-therein and used for detecting and processing various kinds of electrical parameters, a display pane; and a plurality of buttons disposed on a front surface thereof;
a first jaw and a second jaw, both pivotally connected to a top end of the main body, arranged correspondingly and able to be closed or opened, each of the first jaw and the second jaw including a first end and a second end, a first current transformer and a second current transformer being set between the first end and the second end of the first jaw and the first end and the second end of the second jaw respectively, the first current transformer and the second current transformer being connected to a sensor, a test space being formed between the first and the second jaws, an electromagnetic field being detected by the first current transformer and the second current transformer, the test space being used for detecting electromagnetic signals generated by current flowing through; and
a plurality of indicator lights disposed on a surface between the first jaw and the second jaw, a circuit of the sensor connected to the first transformer and the second transformer being also connected to the plurality of indicator lights and the processor of the main body, wherein an object to be detected is placed within the test space and then an electromagnetic field formed by a current of the object within the test space is detected by the first and the second current transformers and a corresponding electromagnetic signal is generated, wherein the sensor connected to the first and the second current transformers gets the electromagnetic signal and sends the electromagnetic signal to the indicator lights and the processor of the main body respectively, wherein the indicator lights on the first jaw and the second jaw are turned on according to the signal received and magnitude of the current is represented by the number of the indicator lights turned on, wherein the electromagnetic signal is converted by the processor of the main body into data including current and voltage to be shown on the display panel of the main body.

2. The device as claimed in claim 1, wherein the indicator lights are arranged along the first jaw and the second jaw and each of the indicator lights is labeled with a number of current therebeside.

3. A clamp meter comprising:
a main body having a processor that is built-therein and used for detecting and processing various kinds of electrical parameters, a display panel disposed in front of the main body and at least one button for controlling or switching of the electrical parameters being processed;
a first jaw and a second jaw, both pivotally connected to a top end of the main body, arranged correspondingly and able to be closed or opened, wherein a test space is formed between the first jaw and the second jaw and the first jaw and the second jaw are arranged with a first current transformer and a second current transformer, wherein an electromagnetic field formed by a current through an object detected within the test space is detected by the first current transformer and the second current transformer and at least one corresponding electromagnetic signal is generated when the first jaw and the second jaw are closed, wherein the electrical parameters includes alternate current (AC) voltage, direct current (DC) voltage, resistance, and current; and
a plurality of indicator lights is disposed on a surface of the first jaw and the second jaw and each of the indicator light is labeled with a number of current therebeside, wherein a current of the indicator lights is connected to the first current transformer and the second current transformer, thereby the electromagnetic field of the object detected within the test space is detected by the first and the second current transformers and the corresponding electromagnetic signal is generated when the object detected is set within the test space, thus the indicator lights are turned on according to the electromagnetic signal detected after the sensor gets the electromagnetic signal.

4. The device as claimed in claim 3, wherein the indicator lights get power by a circuit connected to a power source of the main body.

5. The device as claimed in claim 3, wherein the sensor sends the signal to the processor of the main body so that data of the electrical parameter is shown in the display panel of the main body.

* * * * *